United States Patent
Phillips et al.

(10) Patent No.: US 12,024,789 B2
(45) Date of Patent: *Jul. 2, 2024

(54) METHODS FOR FORMING SINGLE CRYSTAL SILICON INGOTS WITH IMPROVED RESISTIVITY CONTROL

(71) Applicant: GlobalWafers Co., Ltd., Hsinchu (TW)

(72) Inventors: Richard J. Phillips, St. Peters, MO (US); Parthiv Daggolu, Creve Coeur, MO (US); Eric Gitlin, St. Peters, MO (US); Robert Standley, Chesterfield, MO (US); HyungMin Lee, Chungcheongnam-do (KR); Nan Zhang, O'Fallon, MO (US); Jae-Woo Ryu, Chesterfield, MO (US); Soubir Basak, Chandler, AZ (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/071,714

(22) Filed: Oct. 15, 2020

(65) Prior Publication Data

US 2021/0071315 A1    Mar. 11, 2021

Related U.S. Application Data

(63) Continuation of application No. 15/855,466, filed on Dec. 27, 2017, now Pat. No. 10,920,337.

(60) Provisional application No. 62/439,743, filed on Dec. 28, 2016.

(51) Int. Cl.
*C30B 15/20* (2006.01)
*C30B 15/04* (2006.01)
*C30B 29/06* (2006.01)

(52) U.S. Cl.
CPC .............. *C30B 15/20* (2013.01); *C30B 15/04* (2013.01); *C30B 29/06* (2013.01)

(58) Field of Classification Search
CPC .......... C30B 15/04; C30B 15/20; C30B 29/06
See application file for complete search history.

(56) References Cited

U.S. PATENT DOCUMENTS

| 2,847,544 | A | * | 8/1958 | Taft, Jr. | .............. H01L 21/00 438/917 |
| 8,317,919 | B2 | | 11/2012 | Bender | |
| 9,051,659 | B2 | | 6/2015 | DeLuca et al. | |

(Continued)

FOREIGN PATENT DOCUMENTS

| CN | 102181919 A | * | 9/2011 |
| CN | 102260900 B | | 11/2013 |

(Continued)

OTHER PUBLICATIONS

Wang, J. H., "Resistivity distribution in bulk growth of silicon single crystals," Journal of Crystal Growth 275 (2005), pp. e73-e78.

(Continued)

*Primary Examiner* — Hua Qi
(74) *Attorney, Agent, or Firm* — Armstrong Teasdale LLP (57) ABSTRACT

Methods for forming single crystal silicon ingots with improved resistivity control and, in particular, methods that involve gallium or indium doping are disclosed. In some embodiments, the ingots are characterized by a relatively high resistivity.

7 Claims, 12 Drawing Sheets

(56) References Cited

U.S. PATENT DOCUMENTS

| | | | |
|---|---|---|---|
| 2003/0159647 A1* | 8/2003 | Arvidson | C30B 15/002 117/30 |
| 2011/0030793 A1 | 2/2011 | Kraiem et al. | |
| 2012/0056135 A1* | 3/2012 | DeLuca | C30B 29/06 206/524.1 |
| 2012/0301386 A1 | 11/2012 | Johnson et al. | |
| 2013/0047913 A1 | 2/2013 | Kernan | |
| 2013/0093058 A1* | 4/2013 | Nakai | C30B 15/04 257/E29.109 |
| 2015/0333193 A1* | 11/2015 | Appel | H01L 31/0288 136/256 |

FOREIGN PATENT DOCUMENTS

| | | | |
|---|---|---|---|
| CN | 105887194 A | * | 8/2016 |
| CN | 105887194 A | | 8/2016 |
| JP | S57118089 A | | 7/1982 |
| JP | H1029894 A | | 2/1998 |
| JP | 2002226295 A | * | 8/2002 |
| JP | 2002226295 A | | 8/2002 |
| WO | 2016027396 A1 | | 2/2016 |
| WO | 2016031164 A1 | | 3/2016 |

OTHER PUBLICATIONS

Wang, J. H., "Resistivity distribution of silicon single crystals using codoping," Journal of Crystal Growth 280 (2005), pp. 408-412.

Wang, J. H., et al., "Control of Axial Resistivity Distribution in Bridgman Silicon Growth," Japanese Journal of Applied Physics, vol. 43, No. 7A (2004), pp. 4079-4081.

Forster, M., et al., "Boron-oxygen defect in Czochralski-silicon co-doped with gallium and boron," Appl. Phys. Lett. 100, 042110 (2012), 8 pgs.

Glunz, S. W., et al., "Comparison of Boron- and Gallium-doped p-Type Czochralski Silicon for Photovoltaic Application," Prog. Photovolt. Res. Appl. 7 (1999), pp. 463-469.

Fourmond, E., et al., "Electrical properties of boron, phosphorus and gallium co-doped silicon," SiliconPV 17-20 (Apr. 2011), 5 pgs.

Chen, P., et al., "Gallium doped Czochralski silicon with phosphorus compensation for photovoltaic application," State Key Lab of Silicon Materials, Zhejiang University, available before Dec. 28, 2016, 9 pgs.

Cuevas, A., et al., "Compensation Engineering for Silicon Solar Cells," Energy Procedia 15 (2012), pp. 67-77.

ABE, Takao, Silicon Crystal Growth and Wafer Processing, pp. 18-19 (1994).

* cited by examiner

METHODS FOR FORMING SINGLE CRYSTAL SILICON INGOTS WITH IMPROVED RESISTIVITY CONTROL

CROSS-REFERENCE TO RELATED APPLICATIONS

This application is a Continuation of U.S. patent application Ser. No. 15/855,466, filed Dec. 27, 2017, which claims the benefit of U.S. Provisional Patent Application No. 62/439,743, filed Dec. 28, 2016, the contents of which are incorporated herein by reference in their entirety.

FIELD OF THE DISCLOSURE

The field of the disclosure relates to methods for forming single crystal silicon ingots with improved resistivity control and, in particular, methods that involve gallium or indium doping. In some embodiments, the ingots are characterized by a relatively high resistivity.

BACKGROUND

Single crystal silicon, which is the starting material for most processes for the fabrication of semiconductor electronic components, is commonly prepared by the so-called Czochralski (CZ) process wherein a single seed crystal is immersed into molten silicon and then grown by slow extraction. Molten silicon is contaminated with various impurities, among which is mainly oxygen, during the time it is contained in a quartz crucible. Some applications, such as advanced wireless communication applications, insulated gate bipolar transistors (IGBT) and low power, low leakage devices, require wafers with a relatively high resistivity such as 1500 ohm-cm ($\Omega$-cm) or more. Product specifications may require a wafer target resistivity within a tolerance of about 300 $\Omega$-cm or may require a minimum resistivity. Product specifications also may require that the material does not change type (i.e., P-type to N-type or vice versa) in a given lot of wafers.

As a crystal is grown using the Czochralski method, impurities in the melt may segregate due to a segregation coefficient which causes the impurity to concentrate in the melt which causes the amount incorporated into the ingot to increase as the ingot is grown. This impurity/dopant segregation effect causes the resistivity of the ingot to change over its length. Further, different impurities in the melt may segregate at different rates which causes their ratio to vary over its length which may cause a type change in the ingot. This causes a portion of the ingot to fall outside of product specifications which increases the "non-prime" portion of the ingot.

Highly pure polysilicon is used for high resistivity ingot production. Highly pure polysilicon is characterized by a spread in the impurity profile which causes a wide spread in the intrinsic resistivity range of the un-doped material and its type. Further, for relatively high resistivity wafers such as above 1500 ohm-cm or more, addition of additional dopant to control the resistivity and ingot type may be difficult as very small amounts of dopants are added so as to maintain the high resistivity of the ingot.

A need exists for methods for preparing high resistivity silicon ingots that increase the prime portion of the ingot and that allow for better resistivity control and/or that simplify extrinsic doping processes.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for producing a single crystal silicon ingot from a silicon melt held within a crucible. Polycrystalline silicon is added to the crucible. The polycrystalline silicon is heated to cause a silicon melt to form in the crucible. A first dopant selected from the group consisting of gallium and indium is added to the crucible. A sample ingot is pulled from the melt. The resistivity of the sample ingot is measured. A second dopant is added to the silicon melt. The amount of second dopant added to the melt is based in part on the measured resistivity of the sample ingot. A product ingot is pulled from the melt.

Another aspect of the present disclosure is directed to a method for producing a single crystal silicon ingot from a silicon melt held within a crucible. Polycrystalline silicon is added to the crucible. The polycrystalline silicon is heated to cause a silicon melt to form in the crucible. An alloy selected from the group consisting of silicon-gallium and silicon-indium is added to the crucible. A product ingot is pulled from the melt.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Provisions of the present disclosure relate to methods for producing a single crystal silicon ingot by the Czochralski method in which gallium or indium are used to compensate for impurities in the polysilicon starting material. In some aspects, gallium or indium is added as a solid-phase alloy to allow relatively small amounts of the dopant to be added. In these or in other embodiments, gallium or indium is added before a sample or pilot ingot is produced to determine the resistivity of the melt before addition of other dopants.

Figure 1:
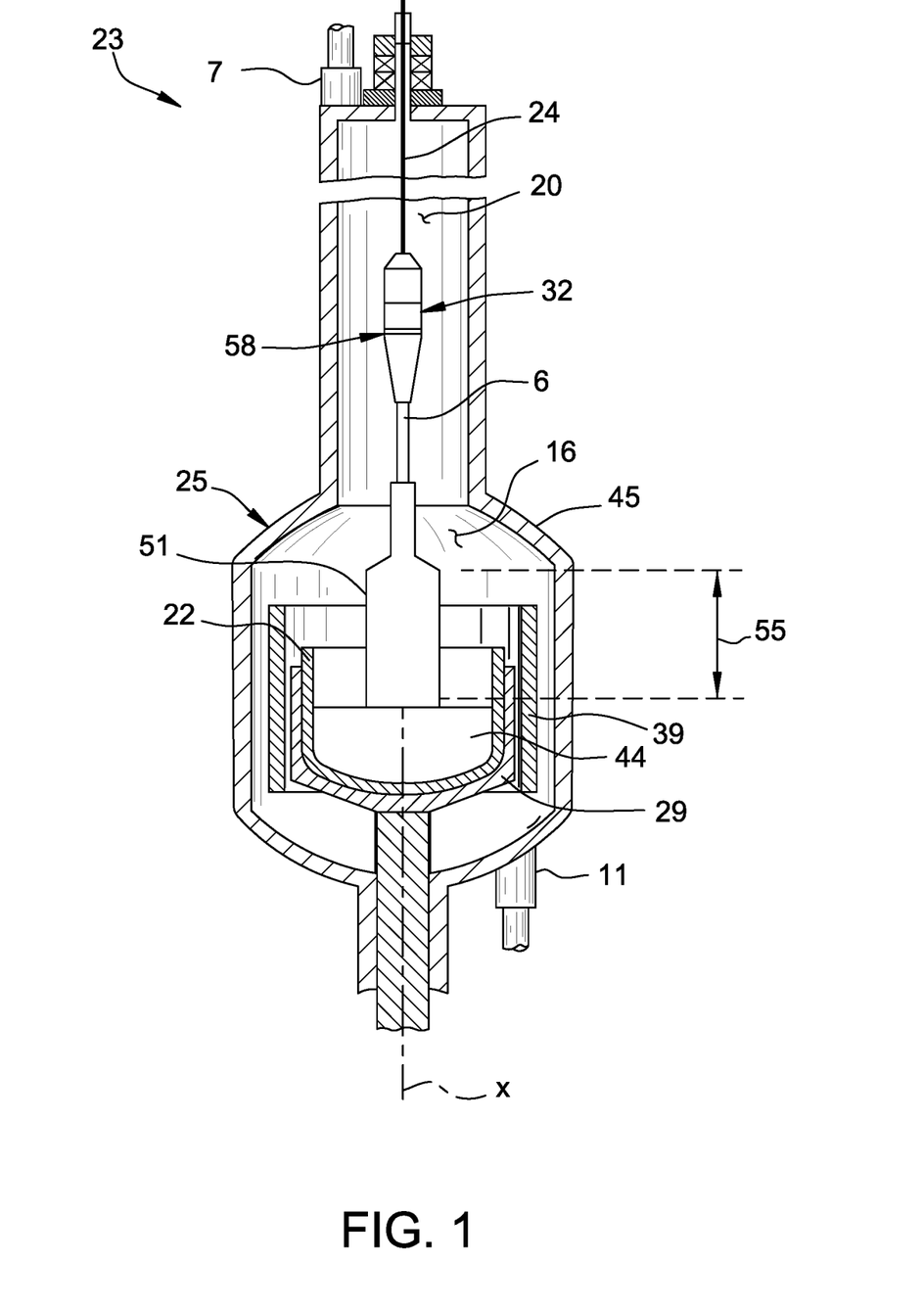
FIG. 1 is a schematic side view of a pulling apparatus for forming a single crystal silicon ingot.

In accordance with embodiments of the present disclosure and with reference to FIG. 1, the ingot is grown by the so-called Czochralski process in which the ingot is withdrawn from a silicon melt 44 held within a crucible 22 of a crystal puller 23.

The ingot puller 23 includes a housing 25 that defines a crystal growth chamber 16 and a pull chamber 20 having a smaller transverse dimension than the growth chamber. The growth chamber 16 has a generally dome shaped upper wall 45 transitioning from the growth chamber 16 to the narrowed pull chamber 20. The ingot puller 23 includes an inlet port 7 and an outlet port 11 which may be used to introduce and remove a process gas to and from the housing 25 during crystal growth.

The crucible 22 within the ingot puller 23 contains the silicon melt 44 from which a silicon ingot is drawn. The silicon melt 44 is obtained by melting polycrystalline silicon charged to the crucible 22. The crucible 22 is mounted on a turntable 29 for rotation of the crucible about a central longitudinal axis X of the ingot puller 23.

A heating system 39 (e.g., an electrical resistance heater 39) surrounds the crucible 22 for melting the silicon charge to produce the melt 44. The heater 39 may also extend below the crucible as shown in U.S. Pat. No. 8,317,919. The heater 39 is controlled by a control system (not shown) so that the temperature of the melt 44 is precisely controlled throughout the pulling process. Insulation (not shown) surrounding the heater 39 may reduce the amount of heat lost through the housing 25. The ingot puller 23 may also include a heat shield assembly (not shown) above the melt surface for shielding the ingot from the heat of the crucible 22 to increase the axial temperature gradient at the solid-melt interface.

A pulling mechanism (not shown) is attached to a pull wire 24 that extends down from the mechanism. The mechanism is capable of raising and lowering the pull wire 24. The ingot puller 23 may have a pull shaft rather than a wire, depending upon the type of puller. The pull wire 24 terminates in a pulling assembly 58 that includes a seed crystal chuck 32 which holds a seed crystal 6 used to grow the silicon ingot. In growing the ingot, the pulling mechanism lowers the seed crystal 6 until it contacts the surface of the silicon melt 44. Once the seed crystal 6 begins to melt, the pulling mechanism slowly raises the seed crystal up through the growth chamber 16 and pull chamber 20 to grow the monocrystalline ingot. The speed at which the pulling mechanism rotates the seed crystal 6 and the speed at which the pulling mechanism raises the seed crystal (i.e., the pull rate v) are controlled by the control system.

A process gas is introduced through the inlet port 7 into the housing 25 and is withdrawn from the outlet port 11. The process gas creates an atmosphere within the housing and the melt and atmosphere form a melt-gas interface. The outlet port 11 is in fluid communication with an exhaust system (not shown) of the ingot puller.

In this regard, the crystal puller 23 shown in FIG. 1 and described herein is exemplary and other crystal puller configurations and arrangements may be used to pull a single crystal silicon ingot from a melt unless stated otherwise.

Figure 2:
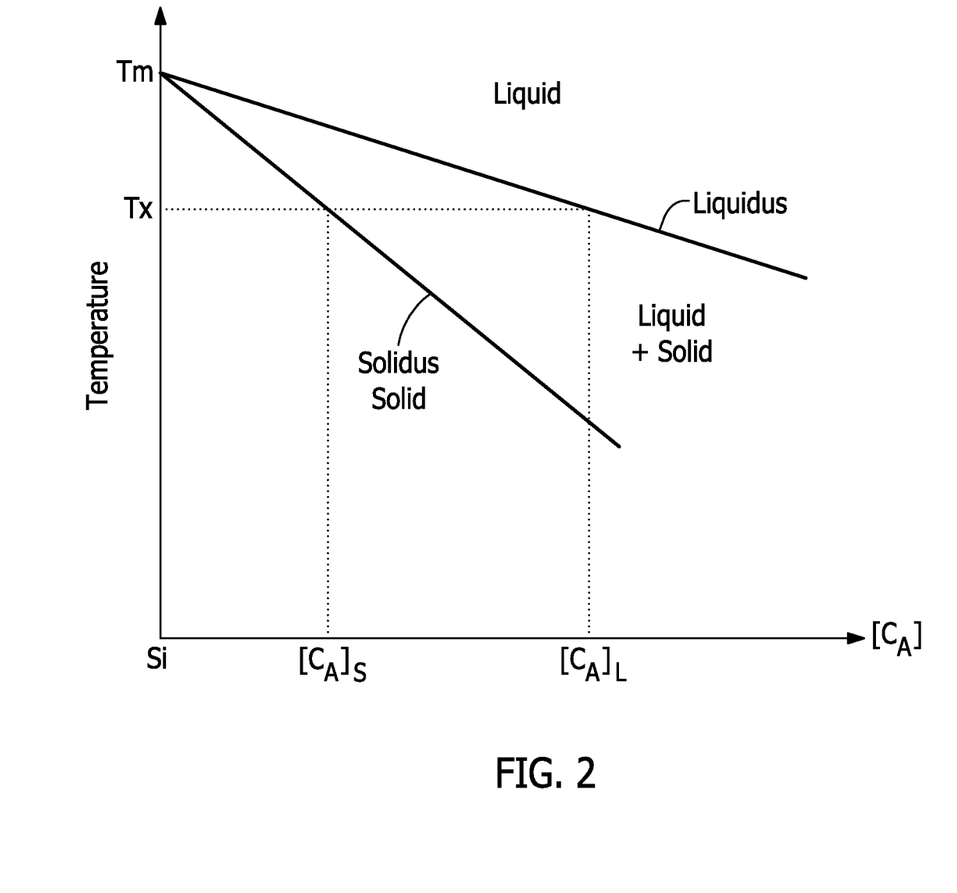
FIG. 2 is a binary phase diagram for silicon containing impurity "A" that has a segregation coefficient less than 1.

Impurities in the melt 44, which can act as dopants in the crystal, segregate into the crystal as part of normal freezing or normal crystal growth. The segregation of an impurity, impurity "A", into the crystal is illustrated in FIG. 2. FIG. 2 shows the temperature plotted against the composition in a silicon-A system. For this mixture, the boundaries are phase boundaries representing the solidus and liquidus. At temperatures below the solidus, the mixture is all solid. Conversely, at temperatures above the liquidus, the mixture is all liquid. For a given temperature, shown as Tx, the segregation coefficient is defined as the ratio of the concentration of A in the solid $[C_A]_S$ to the concentration of A in the liquid, $[C_A]_L$.

Figure 3:
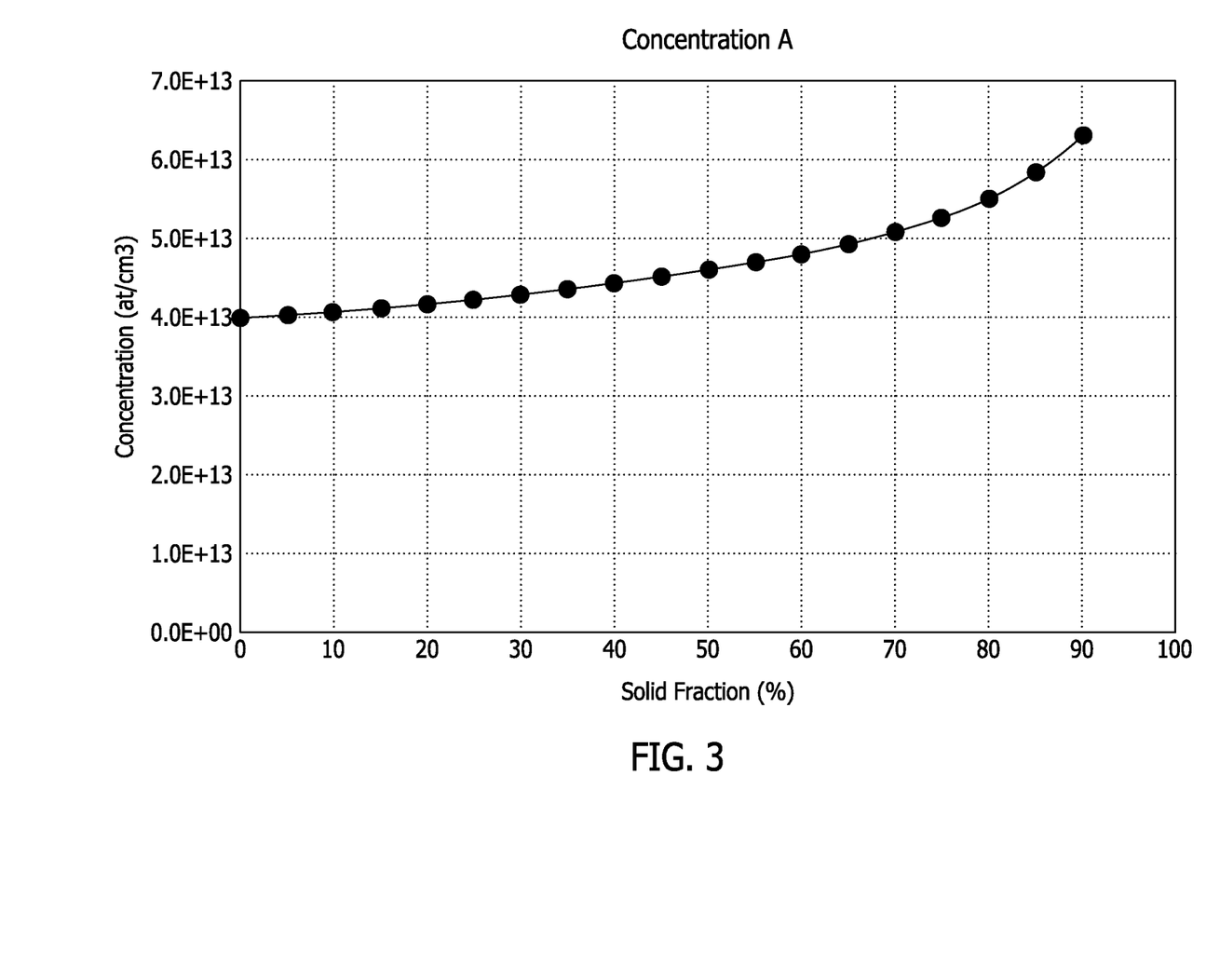
FIG. 3 is the concentration profile of impurity A in the silicon solid fraction.

Thus the segregation is defined by a segregation coefficient, $k_o$, where $k_o=[C_A]_S/[C_A]_L$. Under what is known as "normal" freezing in Czochralski crystal growth, the concentration of impurity A in the solid can be represented as a function of the fraction solidified using the following:

$$[C]_s = k_o[C]_o(1-g)^{k_o-1} \quad \text{(Eq. 1)}$$

wherein $[C]_s$ is the concentration of impurity A in the solid, at a chosen fraction solidified, g, for a starting concentration of impurity A in the initial liquid, $[C]_o$. Knowing the segregation coefficient for impurity A, and the starting liquid concentration, the concentration for increasing fraction solidified can be determined. For an impurity with a segregation coefficient less than one, a typical behavior of the concentration profile of A in the solid is shown in FIG. 3.

Figure 4:
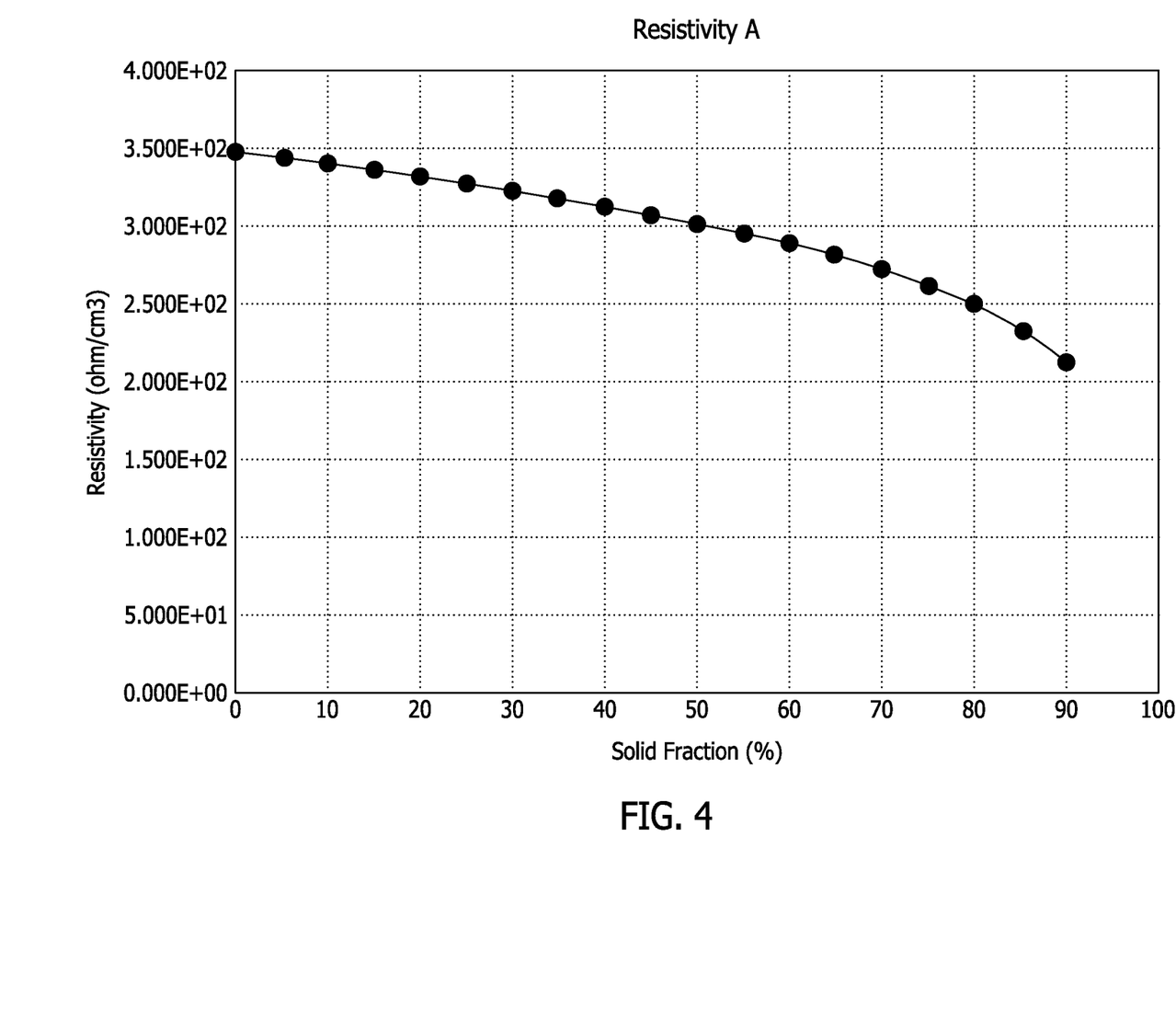
FIG. 4 is the resistivity profile of the solidified solid fraction.

The resistivity is related to the concentration of the dopant element by $$\text{resistivity} = 1/(n\,q\,u) \quad \text{(Eq. 2)}$$

where n is the number of charge carriers, q is the fundamental coulombic charge, and u is the mobility of the charge carrier. Typically the dopant is considered to be fully ionized, and n can be taken as equal to the concentration of the dopant of interest. A resistivity profile can be represented as in FIG. 4.

As multiple elements can be present as donors or acceptors, a net majority of carriers can be calculated as an absolute value as $$n_{net} = |n_{donors} - n_{acceptors}| \quad \text{(Eq. 3).}$$

If the number of donors exceeds the number of acceptors, then the resistivity may be calculated as $$\text{Resistivity} = (n_{net} q\, u_{e^-}) \quad \text{(Eq. 4)}$$

where $u_{e^-}$ is the mobility of electrons. Conversely, if the number of donors is less than the number of acceptors, then the resistivity may be calculated as $$\text{Resistivity} = 1/(n_{net} q\, u_{h^\circ}) \quad \text{(Eq. 5)}$$

where $u_{h^\circ}$ is the mobility of holes.

Given the normal freezing model, it can be seen that for a fixed initial concentration in a multi-dopant system, the concentration profile segregated into the solid as a function of fraction solidified will be regulated by the segregation coefficient for the element of interest. Concentration profiles in the solid, even with starting liquid concentrations being equal, will result in non-equal accumulation of the respective dopants in the solid. Since the resistivity is a net summation of dopants, and thermal donors from oxygen, the crystal type (i.e. n-type or p-type) can change with increasing fraction solidified, as well as extremely large changes in the resistivity.

Figure 5:
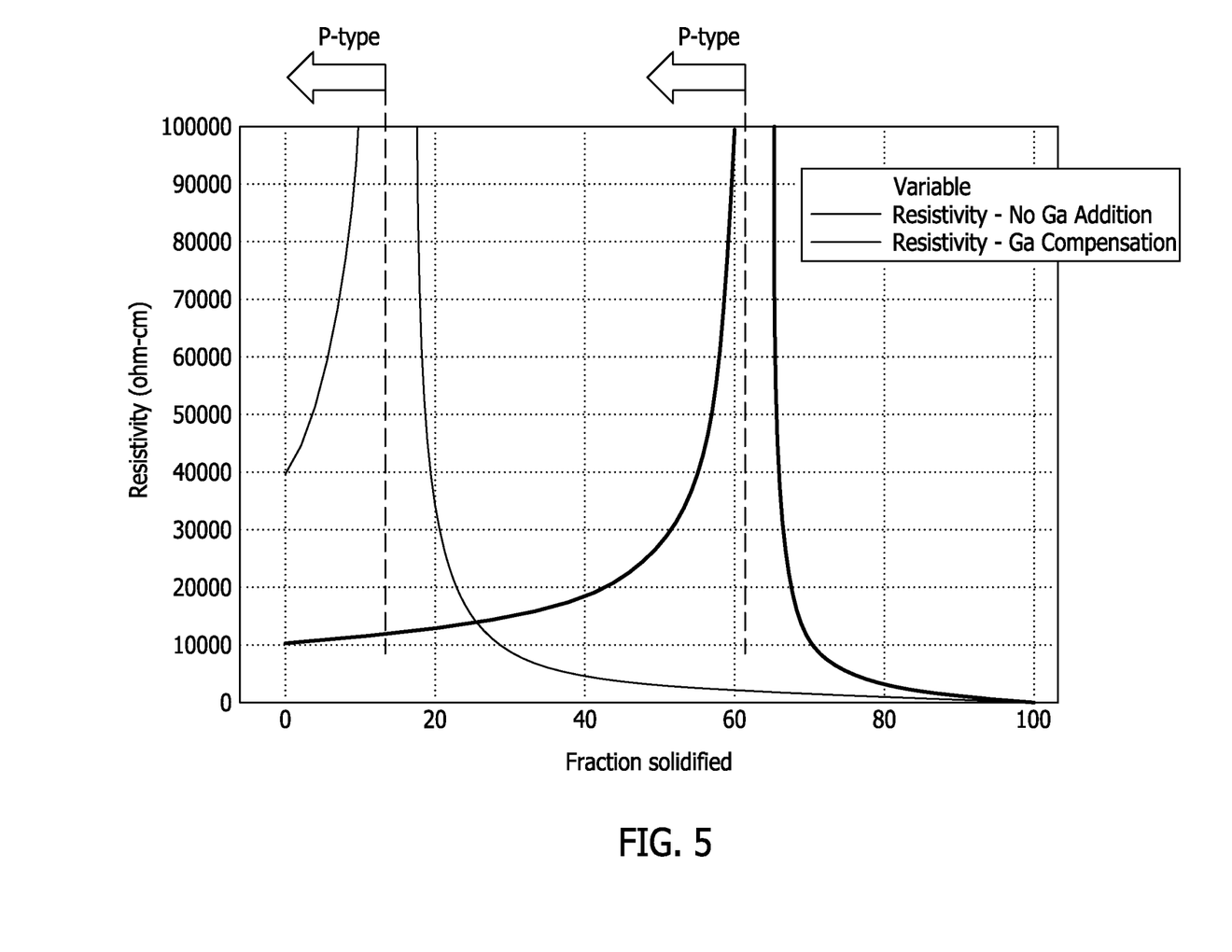
FIGS. 5-8 are diagrams of the resistivity profiles of ingots with and without gallium doping as described in Example 1.

Polycrystalline silicon used as feedstock to prepare the melt 44 in Czochralski crystal pulling methods may include intrinsic amounts of boron, a P-type dopant, and phosphorous, an N-type dopant. Phosphorous has a segregation coefficient (0.35) that is less than boron (0.80) which causes phosphorous to accumulate relative to boron. As shown in FIG. 5, the first portion of the ingot may be P-type. As phosphorous accumulates, it compensates for boron causing a spike in resistivity, after which the ingot is N-type.

In order to compensate for large resistivity changes in systems containing such as boron and phosphorus, as well as avoiding the crystal type changing due to the difference in segregation coefficients, in embodiments of the present disclosure, a dopant such as gallium or indium which has a smaller segregation coefficient (0.008, $4\times10^{-4}$, respectively) than impurities such as boron and phosphorous is added to the crucible before the ingot is grown.

For resistivity ranges associated with high resistivity semiconductor products, gallium compensation together with phosphorous and boron as well as sustaining oxygen below 4 nppma or even below 3.5 nppma, less than about 3 nppma or less than about 2.5 nppma can result in avoiding type change within the crystal as well as reduce large changes in the resistivity.

In accordance with embodiments of the present disclosure, polycrystalline silicon is added to the crucible 22. The polycrystalline silicon is heated to cause silicon to liquefy and form a melt in the crucible. A first dopant selected from the group consisting of gallium and/or indium is added to the crucible (before or after melting of the polycrystalline silicon). A sample ingot or "rod" is pulled from the melt and the resistivity of the sample rod is measured. A second dopant is added to the melt, with the amount of second dopant added to the melt being based, in part, on the measured resistivity of the sample rod and, in part, the desired resistivity of the product ingot. A product ingot is then pulled from the melt with at least a portion of the body portion of the ingot having a desired, target resistivity.

The polysilicon to which the first dopant is added and from which a sample ingot and product ingot is pulled may be semiconductor grade polysilicon. When semiconductor grade polysilicon is used, in some embodiments the polysilicon has a resistivity greater than 4,000 Ω-cm and contains no more than 0.02 ppba boron or phosphorous. The total bulk metal content in such polysilicon may be preferably less than 2 ppma.

In some embodiments, the first dopant that is added to the crucible is gallium. Generally, a relatively small amount of gallium is added to the crucible. For example, the melt may contain less than about 0.5 ppma gallium (as measured after addition of gallium and before pulling of the sample ingot) or even less than about 0.1 ppma, less than 0.01 ppma or less than about 0.001 ppma gallium. In some embodiments, the concentration of gallium in the melt after gallium addition is from about 0.00001 ppma to about 0.5 ppma or from about 0.0001 ppma to about 0.1 ppma. In this regard, the stated concentration ranges of gallium (and indium below) are exemplary and the amount of gallium may be chosen based, in part, on the desired resistivity and the amount of other electroactive dopants (e.g., boron, phosphorous, aluminum and the like).

In terms of volume concentration, the resulting melt may have a gallium concentration of less than about $5\times10^{15}$ atoms/cm$^3$, less than about $1\times10^{15}$ atoms/cm$^3$, less than about $5\times10^{14}$ atoms/cm$^3$ or less than about $1\times10^{14}$ atoms/cm$^3$.

Alternatively or in addition to gallium, indium may be used as the first dopant. The concentration of indium in the melt after indium is added to the crucible may be less than about 0.5 ppma (as measured after addition of indium and before pulling of the sample ingot) or even less than about 0.1 ppma, less than 0.01 ppma or less than about 0.001 ppma indium. In some embodiments, the concentration of indium in the melt after indium addition is from about 0.00001 ppma to about 0.5 ppma or from about 0.0001 ppma to about 0.1 ppma. In terms of volume concentration, the resulting melt may have an indium concentration of less than about $5\times10^{15}$ atoms/cm$^3$, less than about $1\times10^{15}$ atoms/cm$^3$, less than about $5\times10^{14}$ atoms/cm$^3$ or less than about $1\times10^{14}$ atoms/cm$^3$. It should be noted that the listed amounts of first dopant are exemplary and other amounts may be used unless stated otherwise.

In some embodiments, the first dopant is added to the polysilicon charge as a solid-phase alloy. For example, gallium or indium may be added as a solid-phase gallium-silicon alloy or indium-silicon alloy. Such solid-phase gallium/indium-silicon alloys may include less than about 20 wt % gallium or indium or less than about 5 wt % gallium or indium or less than about 1 wt % gallium or indium or less than 0.5 wt % gallium or indium, from about 0.001 wt % to about 5 wt % or from about 0.01 wt % to about 1 wt % gallium or indium. The amount of alloy that is added to the crucible may depend on the size of the charge and the amount of gallium incorporated therein. In some embodiments, about 0.5 grams to about 50 grams or about 1 gram to about 15 grams of gallium or indium alloy is added to the crucible.

The alloy may be prepared by weighing the desired amounts of first dopant (e.g., gallium) and silicon and melting the materials and solidifying in a low gradient furnace. The material may be separated from its container (e.g., quartz container) and acid washed (e.g., HF). The acid washed material may be dried, crushed and sized. In some embodiments, the material is sized with a maximum size of 5 mm or less, 3 mm or less or even 1 mm or less.

After polysilicon is added to the crucible, the first dopant (i.e., gallium and/or indium) is added and the polysilicon material is melted down. Alternatively, the first dopant may be added during or after polysilicon melt-down.

After the first dopant selected from gallium or indium is added and the polysilicon charge is liquefied, a sample ingot is pulled from the melt and the resistivity of the sample ingot is measured. Generally, the sample ingot may be any suitable size and, in some embodiments, has a diameter from about 200 mm to about 300 mm and a length of at least 100 mm, 300 mm, or more.

In some embodiments, the amount of first dopant added is sufficient to adjust the resistivity of the sample ingot to about 10,000 ohm-cm or less or about 5,000 ohm-cm or less or about 2,500 ohm-cm or less (e.g., from about 500 ohm-cm to about 10,000 ohm-cm or from about 500 ohm-cm to about 5,000 ohm-cm or from about 1000 ohm-cm to about 3000 ohm-cm).

After the sample ingot is produced, the resistivity of the sample ingot is determined. The resistivity may be measured (e.g., by a four-point resistivity probe) at various points along the solid fraction and/or across the diameter of a wafer or slug.

The second dopant (e.g., phosphorous or boron) is added to the crucible after the resistivity of the sample ingot is determined. Generally the second dopant that is added to the melt to achieve the target resistivity is any n-type dopant and is typically phosphorous. In other embodiments, depending on the measured magnitude of the resistivity of the sample ingot, boron dopant may be used to achieve the desired target resistivity.

The amount of second dopant that is added is based, at least in part, on the measured resistivity of the sample rod and a target resistivity for a prime portion 55 (FIG. 1) of the product ingot 51. The amount of second dopant used may be determined based on Equations 2-5 provided above.

In some embodiments, the target resistivity of the prime portion of the ingot may be a minimum resistivity. In some embodiments, the entire length of the ingot (e.g., length of the body of the ingot) has the target resistivity (e.g., minimum resistivity). In some embodiments, the target resistivity is a minimum resistivity of at least about 1,500 Ω-cm or, as in other embodiments, at least about 2,000 Ω-cm, at least about 4,000 Ω-cm, at least about 6,000 Ω-cm, at least about 8,000 Ω-cm, at least about 10,000 Ω-cm or from about 1,500 Ω-cm to about 50,000 ohm-cm or from about 8,000 Ω-cm to about 50,000 Ω-cm.

After the second dopant is added, the product ingot is withdrawn from the melt. The product ingot may have a diameter of about 150 mm or, as in other embodiments, about 200 mm, about 300 mm or more (e.g., 450 mm or more).

Figure 9:
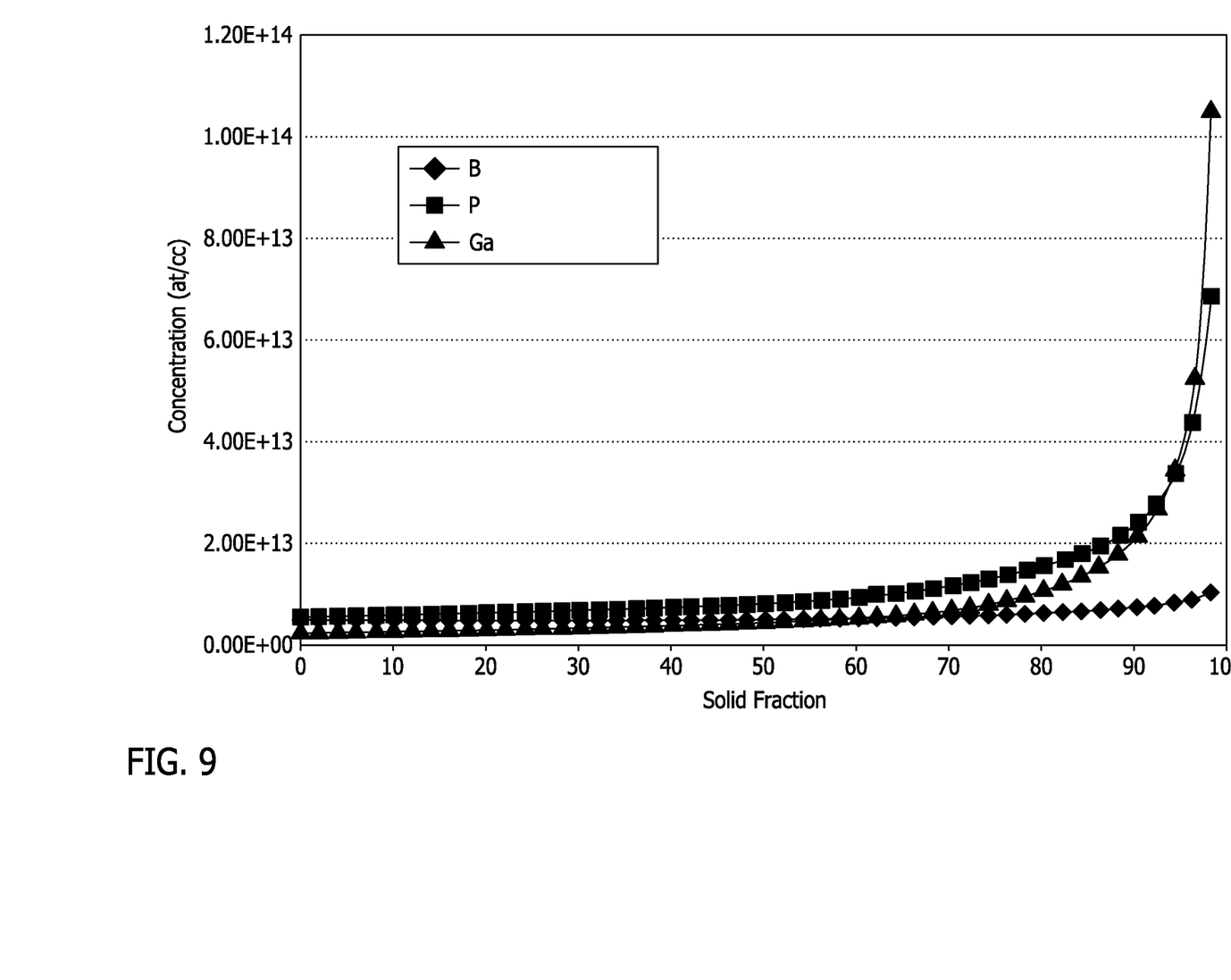
FIG. 9 is a diagram showing the composition segregation curves for boron, phosphorous and gallium for an ingot produced according to Example 1.

Compared to conventional methods, the methods of embodiments of the present disclosure for growing a single crystal silicon ingot have several advantages. Relatively high purity polysilicon that is used to produce relatively high resistivity single crystal silicon has a wide spread in boron and phosphorous impurity amounts which causes a wide spread in the intrinsic resistivity. The wide spread in resistivity and the high-resistivity itself cause errors in the resistivity measurement. By adding gallium or indium before the sample ingot is grown, the variation in resistivity and the resistivity itself is reduced which reduces the error in the resistivity measurement. For example, reduced measurement error may be observed by adjusting the amount of gallium or indium to yield a resistivity of, for example, about 1,000 ohm-cm to about 2,000 ohm-cm. By adding gallium before addition of the second dopant (e.g., phosphorous), the amount of second dopant added is increased to compensate to the desired net charge carrier concentration which results in the desired resistivity. Addition of a higher amount of second dopant (e.g., increase in 10 fold amount such as addition of several grams rather than several milligrams of second dopant) reduces errors in weight measurement and improves the transfer efficiencies of second dopant (e.g., dopant cup to the polysilicon stack). Further, addition of first dopant such as gallium eliminates or at least delays the transition of the ingot type as the first dopant is characterized by a smaller segregation coefficient, even smaller than phosphorous dopant. This allows gallium to closely follow and counter the steep rise in phosphorous concentration as shown in FIG. 9. In embodiments in which a solid-phase alloy of the first dopant is used (e.g., containing less than 5 wt % gallium/indium), the alloy material has a larger mass and volume relative to the pure first dopant alone which reduces error in the measurement of the material and improves transfer efficiency. By using an alloy of gallium or indium, the melting temperature of the material is raised (e.g., from the 29.7° C. melting temperature of pure gallium when gallium is used) which eases transfer into the crucible. The solid-phase alloy also stays as a solid until it is melted in the polysilicon charge, allowing for ease of handling without the need to keep the material (e.g., pure gallium) refrigerated or cooled to below its melting temperature.

EXAMPLES

The processes of the present disclosure are further illustrated by the following Examples. These Examples should not be viewed in a limiting sense.

Example 1: Gallium Doping to Defer Ingot Type Change

The type change in a single crystal silicon wafer resulting from build-up of boron and phosphorous impurity accumulation was modeled and is shown in FIG. 5. As shown in FIG. 5, type-change from P-type to N-type occurred at about 17% solidified fraction due to the accumulation of phosphorous relative to boron. Addition of gallium defers the type change from P-type to N-type to about 62% of the solidified fraction. This indicates that gallium acts to compensate for phosphorous impurity accumulation. Given a resistivity target of from about 10,000 ohm-cm to about 50,000 ohm-cm, use of gallium resulted in a 40% yield improvement.

Figure 6:
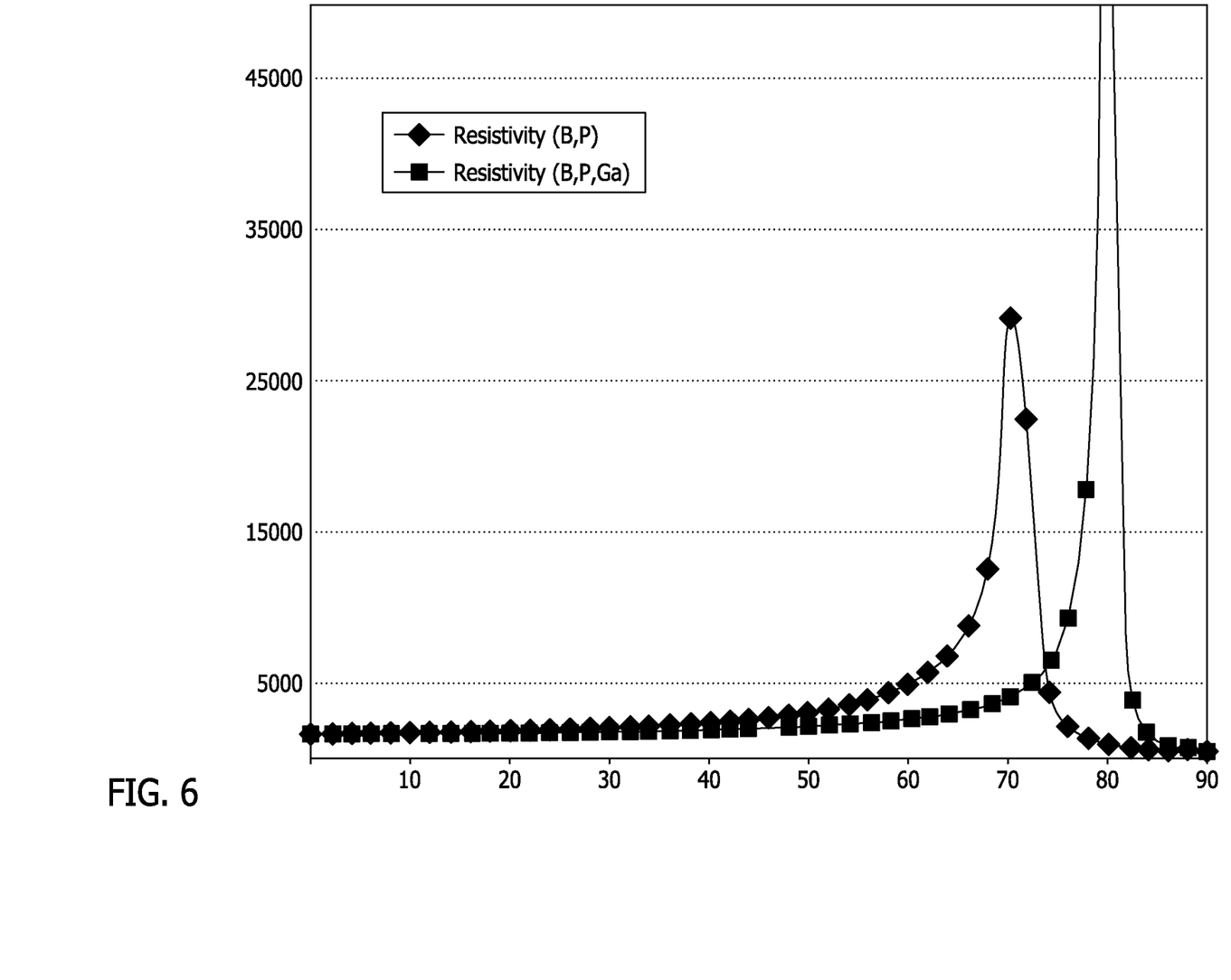

The resistivity profiles for ingots having $2.1 \times 10^{13}$ atoms/$cm^3$ boron, $2.73 \times 10^{13}$ atoms/$cm^3$ phosphorous and with and without $1.0 \times 10^{14}$ atoms/$cm^3$ gallium are shown in FIG. 6. As shown in FIG. 6, use of gallium deferred the type change from about 70% of the solidified fraction to about 80%.

Figure 7:
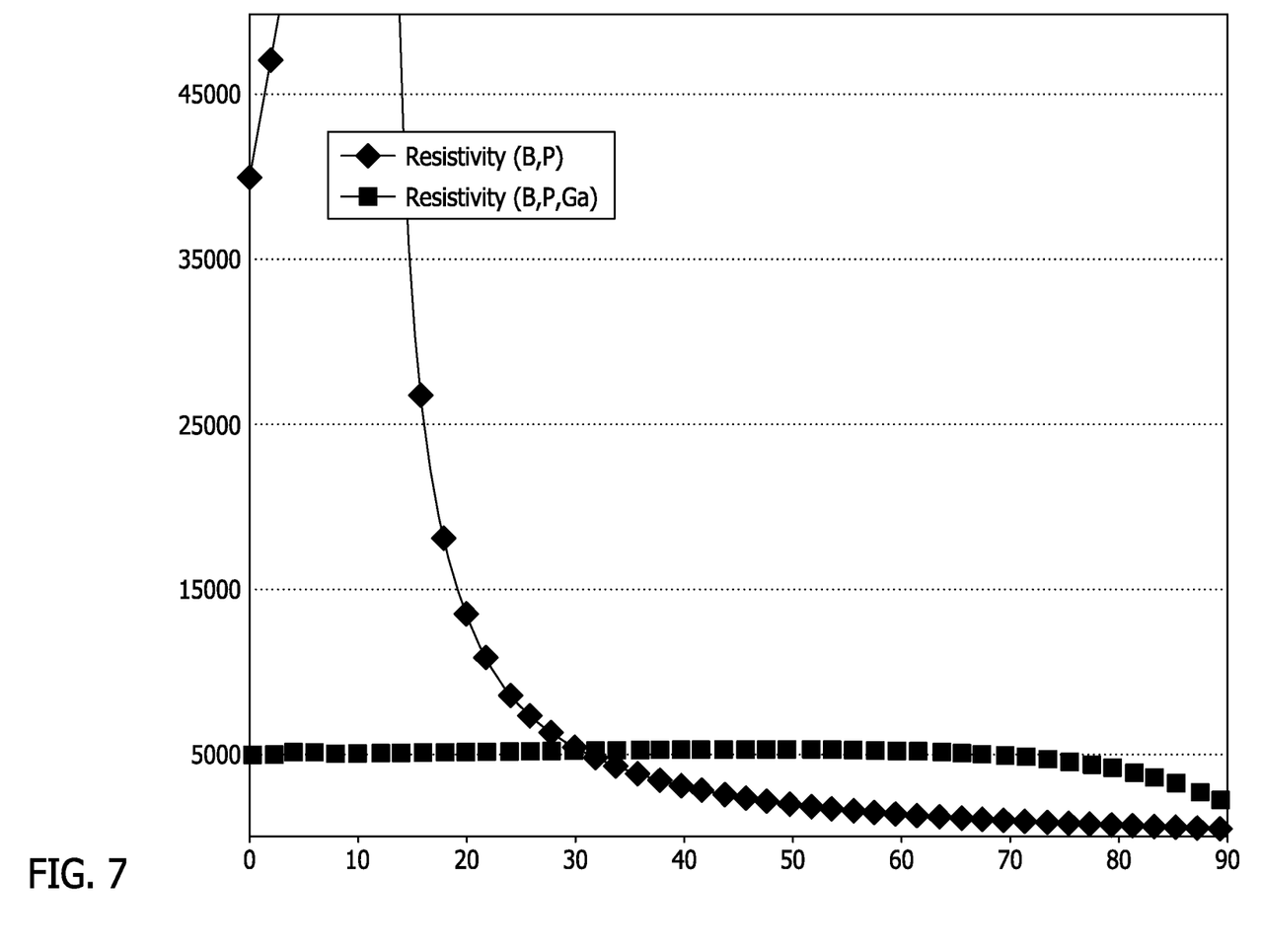

The resistivity profiles for ingots having $8 \times 10^{12}$ atoms/$cm^3$ boron, $1.75 \times 10^{13}$ atoms/$cm^3$ phosphorous and with and without $3 \times 10^{14}$ atoms/$cm^3$ gallium are shown in FIG. 7. As shown in FIG. 7, when gallium was not used the type change to N-type occurred at about 10% of the solidified fraction. Use of gallium allowed the ingot to remain P-type throughout the length of the body.

Figure 8:
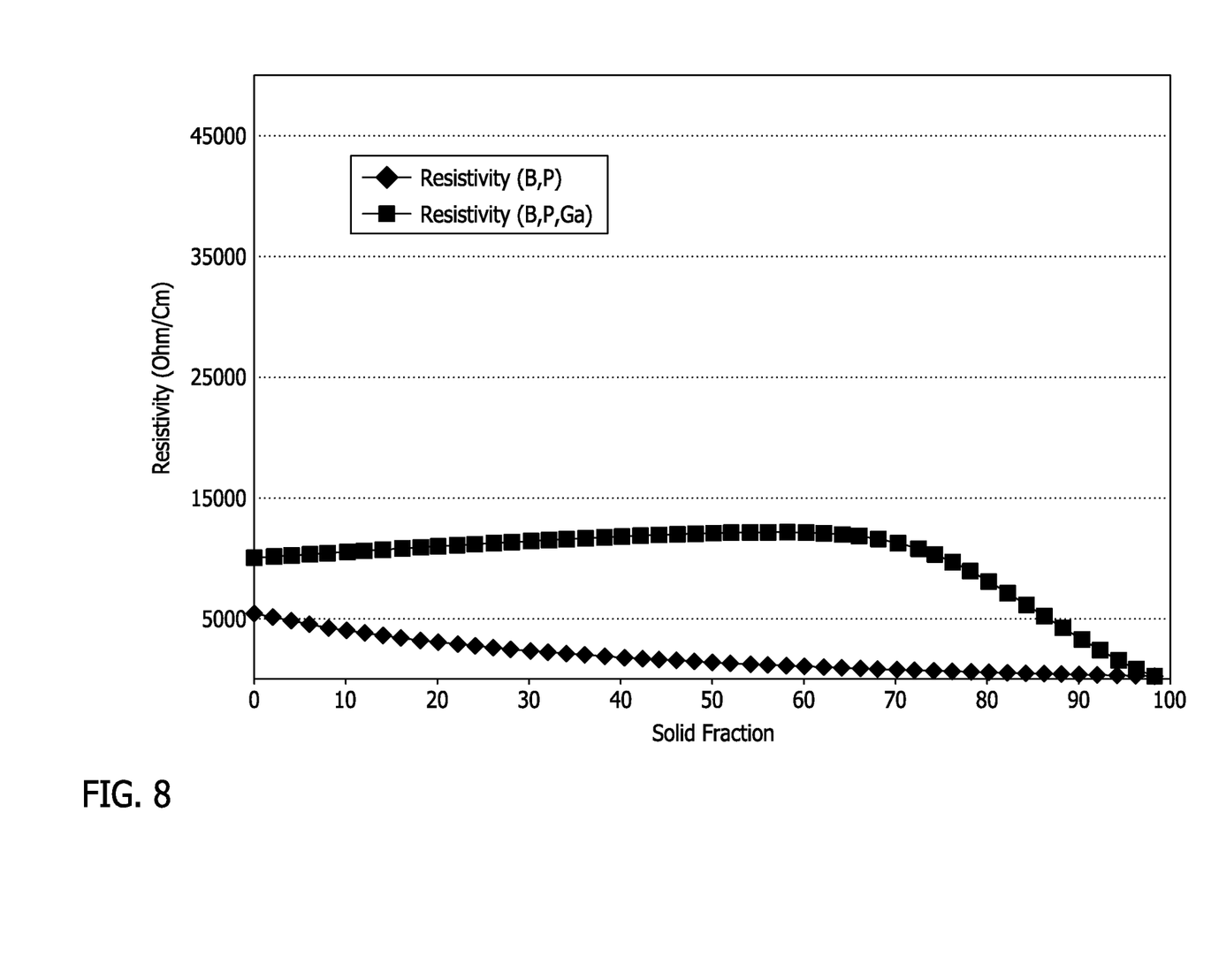

The resistivity profiles for an ingot having $5.7 \times 10^{12}$ atoms/$cm^3$ boron, $1.52 \times 10^{13}$ atoms/$cm^3$ phosphorous and with and without $2.67 \times 10^{14}$ atoms/$cm^3$ gallium are shown in FIG. 8. The ingot without gallium doping was N-type and the ingot that was doped with gallium was P-type. The composition segregation curves for boron, phosphorus and gallium are shown in FIG. 9.

Figure 10:
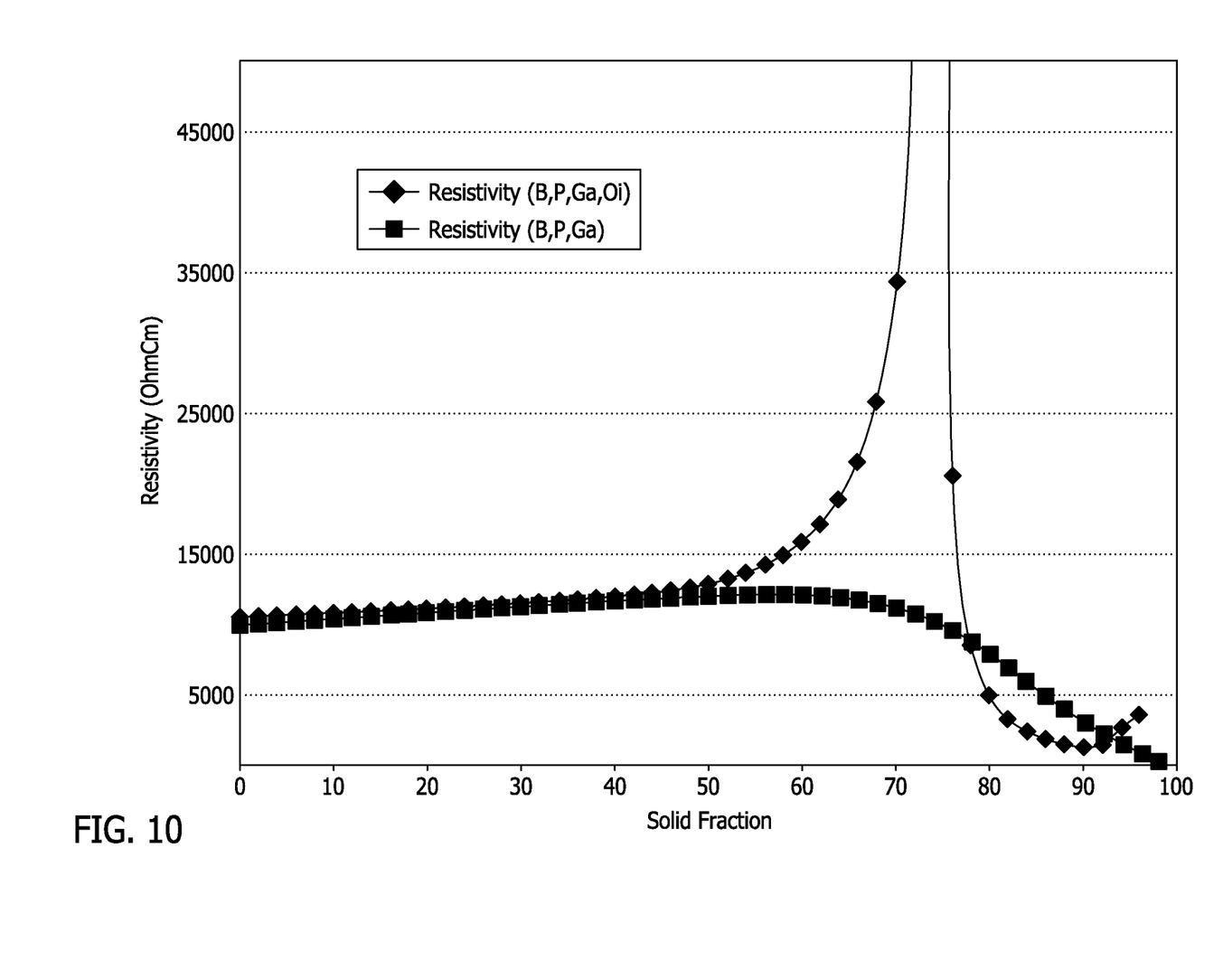
FIG. 10 is a diagram of the resistivity profile of ingots with and without gallium doping with oxygen donors contributing to the resistivity as described in Example 1.

The resistivity profiles for ingots having the same dopant profile as FIG. 8 were modeled with the effect of oxygen (i.e., thermal donors) being taken into account. As shown in FIG. 10, the ingot in which thermal donors were taken into account type-changed to N-type at about 75% and the ingot that did not account for thermal donors was P-type throughout the body portion. Given the thermal donor effect, it is desired to sustain oxygen at a relatively low value such that thermal donor effects are managed. Increased oxygen will result in increased net resistivity, but can allow the type change to occur earlier in the body length. Oxygen targets below 4 nppma or even below 3.5 nppma assist in suppressing type change along with compensation dopant management.

Figure 11:
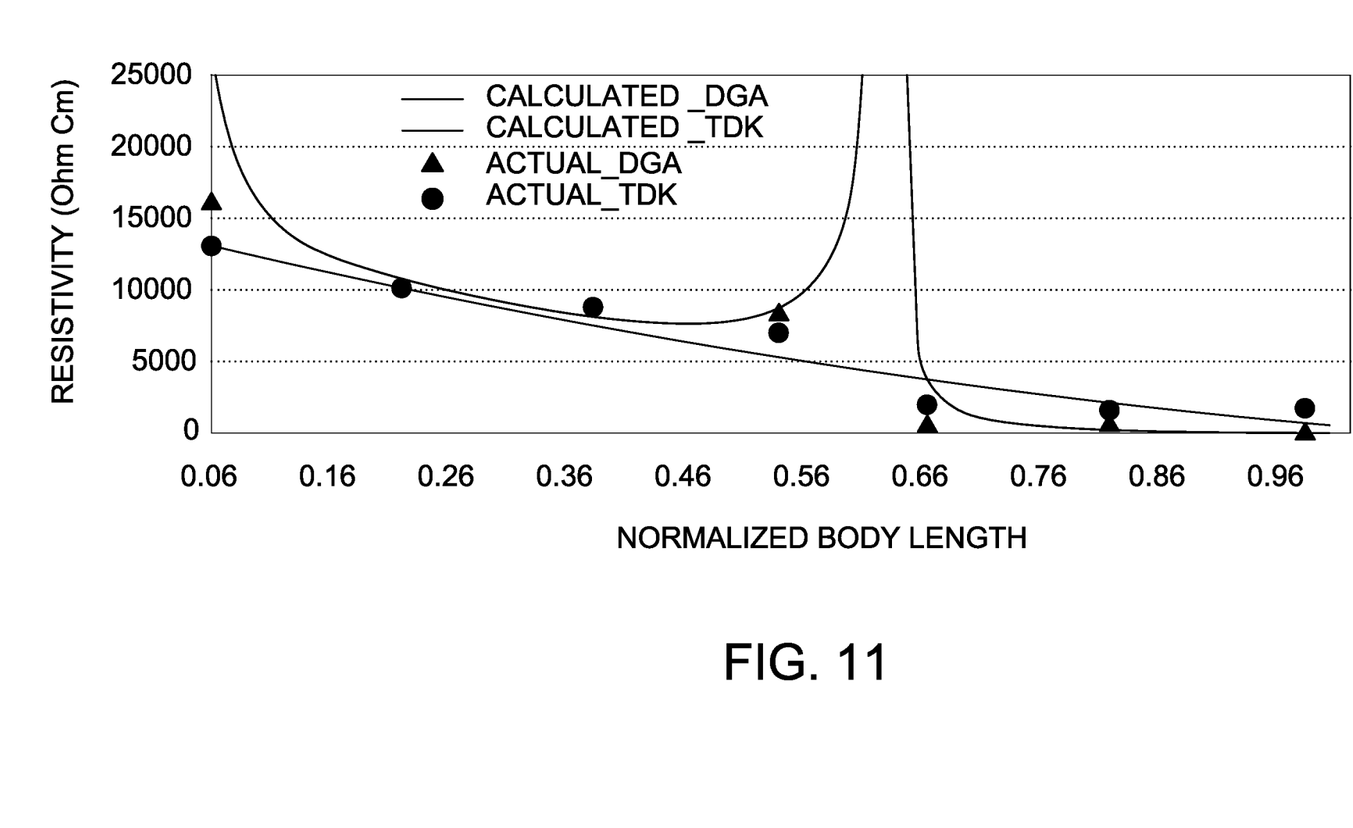
FIG. 11 is a diagram showing the modeled and measured resistivity profiles for a gallium compensated system with thermal donor effects.

FIG. 11 shows the resistivity profile of a gallium compensated system considering the thermal donor effects. In one instance the ingot underwent a thermal donor kill anneal to eliminate the oxygen contribution to the resistivity and in another the ingot underwent a heat treatment to fully ionize the thermal donors. As shown in FIG. 11, the measured resistivity values closely matched the modeled values.

Example 2: Gallium Alloy Formation

Figure 12:
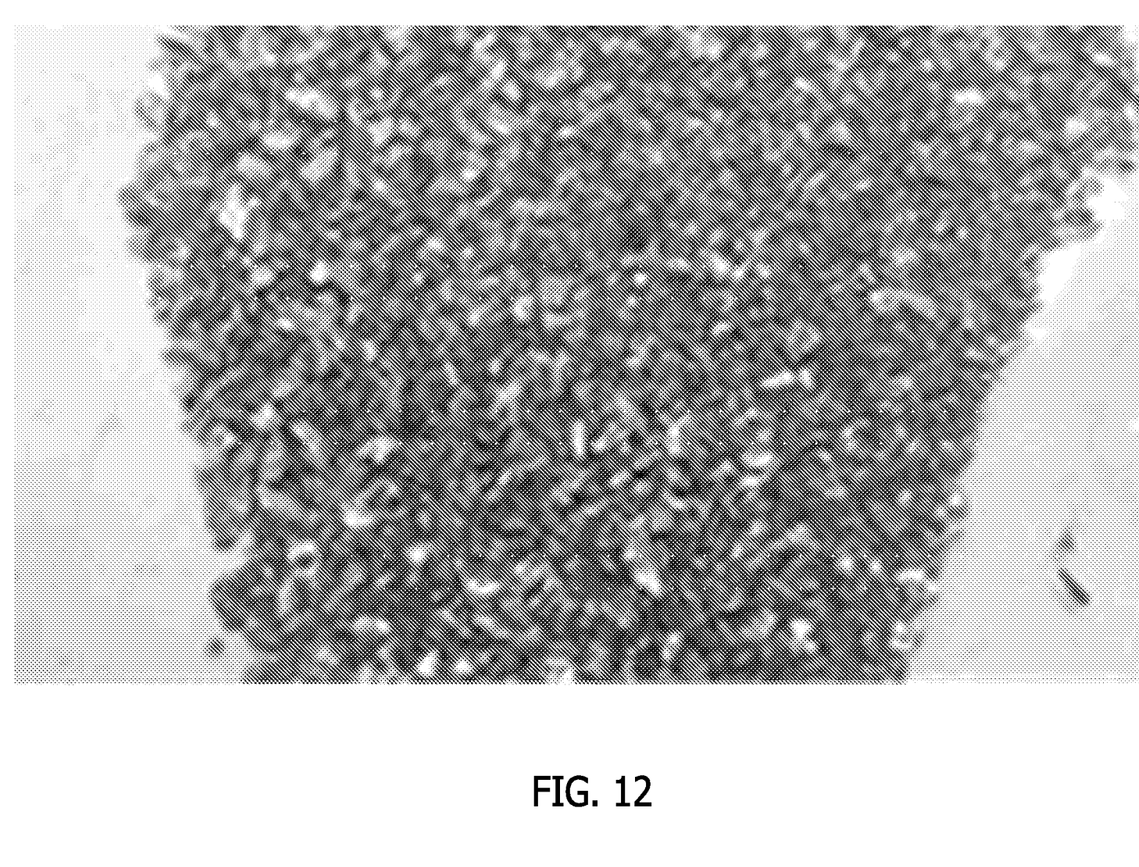
FIG. 12 is a photo of granular gallium-silicon alloy prepared according to Example 2.

To facilitate the small amount of gallium used to control resistivity, a master gallium-silicon alloy was produced. The alloy had a gallium concentration in the range of 0.1 to 0.3 wt %. Amounts of silicon and gallium were weighed. The materials were melted and frozen in a quartz container in low gradient furnace. The alloy material was separated from the container and acid washed in HF. The alloy was then dried, crushed, sized and cleaned to less than 3 mm. The resulting alloy material is shown in FIG. 12. The resulting gallium-silicon alloy material was suitable for use for gallium doping as described in Example 1.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A method for producing a single crystal silicon product ingot from a silicon melt held within a crucible, the method comprising:
    adding polycrystalline silicon to the crucible;
    heating the polycrystalline silicon to cause the silicon melt to form in the crucible;
    adding a first dopant to the crucible, the first dopant being an alloy selected from the group consisting of silicon-gallium and silicon-indium, the silicon melt comprising silicon and the first dopant;
    pulling a sample ingot from the silicon melt after adding the alloy, there being a silicon melt comprising silicon and first dopant disposed in the crucible after the sample ingot is pulled;
    measuring a resistivity of the sample ingot;
    adding an amount of second dopant to the silicon melt comprising silicon and the first dopant after pulling the sample ingot to form a silicon melt comprising silicon, the first dopant and the second dopant, the second dopant being selected from the group consisting of phosphorous and boron, the amount of second dopant added to the silicon melt being based at least in part on the measured resistivity of the sample ingot; and
    pulling the single crystal silicon product ingot from the silicon melt comprising silicon, the first dopant and the second dopant after adding the second dopant to the silicon melt.

2. The method as set forth in claim 1 wherein the alloy is silicon-gallium and comprises less than 5 wt % gallium.

3. The method as set forth in claim 1 wherein the alloy is silicon-gallium and a concentration of gallium in the silicon melt after gallium is added to the crucible is less than 0.1 ppma.

4. The method as set forth in claim 1 wherein the alloy is silicon-indium and comprises less than 5 wt % indium.

5. The method as set forth in claim 1 wherein the alloy is silicon-indium and a concentration of indium in the silicon melt after indium is added to the crucible is less than 0.1 ppma.

6. The method as set forth in claim 1 wherein the product ingot has a prime portion with a resistivity of at least about 1,500 Ω-cm.

7. The method as set forth in claim 1 wherein the polycrystalline silicon is semiconductor grade silicon.

* * * * *